United States Patent

Suck et al.

(10) Patent No.: US 6,886,548 B2
(45) Date of Patent: May 3, 2005

(54) INTERNAL COMBUSTION ENGINE

(75) Inventors: Gerrit Suck, Lehrte (DE); Günter Söhlke, Gifhorn (DE); Detlev Repenning, Reinbeck (DE)

(73) Assignees: Volkswagen AG, Wolfsburg (DE); O.M.T. GmbH, Lubeck (DE)

( * ) Notice: Subject to any disclaimer, the term of this patent is extended or adjusted under 35 U.S.C. 154(b) by 0 days.

(21) Appl. No.: 10/481,851

(22) PCT Filed: Apr. 4, 2002

(86) PCT No.: PCT/EP02/03741

§ 371 (c)(1),
(2), (4) Date: Dec. 22, 2003

(87) PCT Pub. No.: WO03/002859

PCT Pub. Date: Jan. 9, 2003

(65) Prior Publication Data

US 2004/0149273 A1 Aug. 5, 2004

(30) Foreign Application Priority Data

Jun. 28, 2001 (DE) .......................... 101 30 673

(51) Int. Cl.⁷ ............................................... F02B 51/02
(52) U.S. Cl. ..................... 123/670; 123/188.7; 123/669
(58) Field of Search .......................... 123/188.3, 188.7, 123/668, 669, 670

(56) References Cited

U.S. PATENT DOCUMENTS

| 2,782,592 A | 2/1957 | Kolfenbach |
| 4,529,626 A | 7/1985 | Baker et al. |
| 4,530,340 A | 7/1985 | Totman |
| 5,891,584 A | 4/1999 | Coffinberry |

FOREIGN PATENT DOCUMENTS

| DE | 43 17 254 | 2/1995 |
| GB | 603120 | 6/1948 |

*Primary Examiner*—Noah P. Kamen
(74) *Attorney, Agent, or Firm*—Ostrolenk, Faber, Gerb & Soffen, LLP

(57) ABSTRACT

An internal combustion engine having a cylinder and a piston movable in the cylinder, the cylinder and piston defining a combustion chamber enclosed by the cylinder and the piston, a surface of at least one of at least one component of the combustion chamber and an adjoining space that comes into contact with at least one of a fuel-air mixture to be combusted and with motor oil has, at least in certain areas, a catalytic coating for oxidizing carbonization residues, the coating consists of a ternary vanadium oxide compound and at least one other compound of at least one metal oxide, the metal oxide is at least one of the group consisting of a cerium oxide, an oxide of another rare-earth metal, an oxide of lanthanum (La), and an oxide of a transition metal.

16 Claims, 1 Drawing Sheet

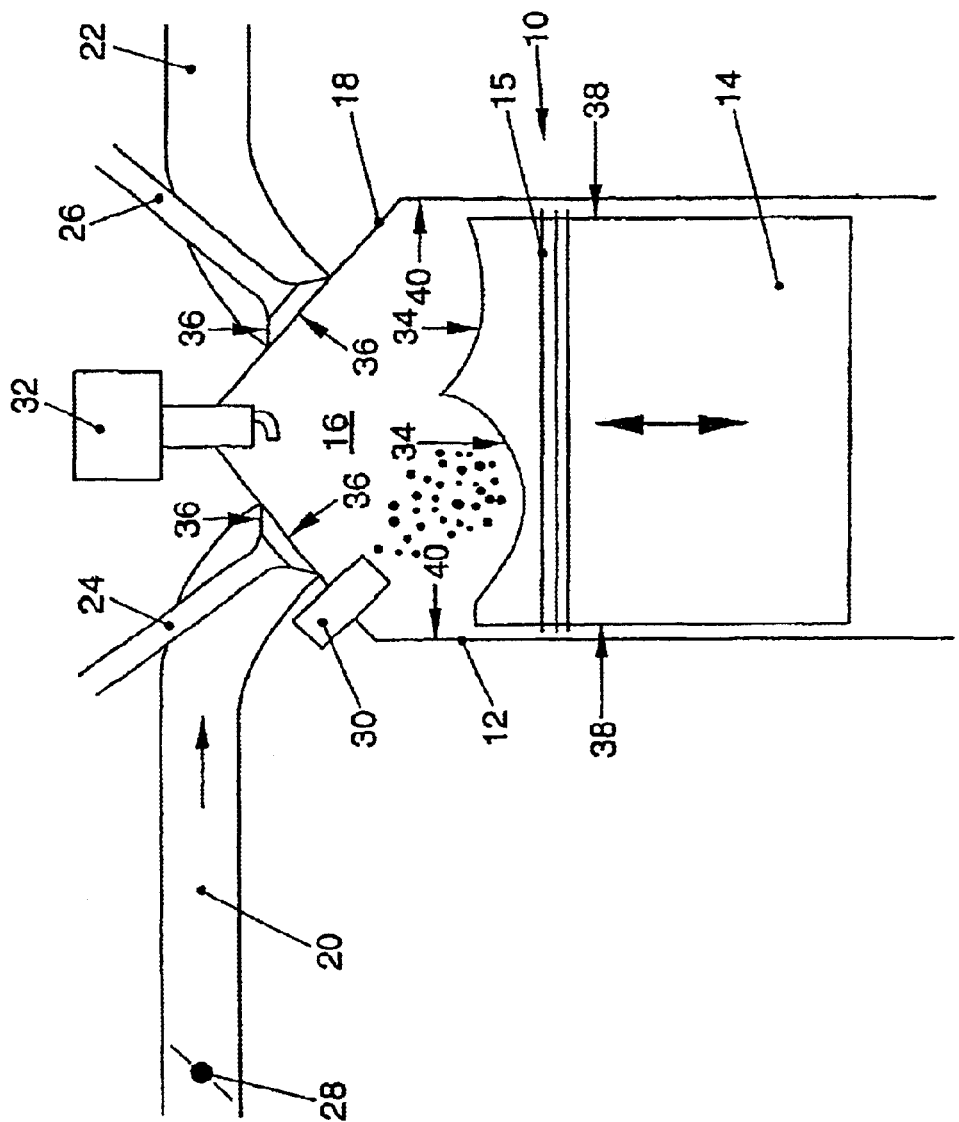

INTERNAL COMBUSTION ENGINE

This application is a U.S. National stage of PCT/EP02/03741, filed Apr. 4, 2002 and claims priority from German Application No. 101 30 673 3, filed Jun. 28, 2001.

BACKGROUND OF THE INVENTION

The invention concerns an internal combustion engine with at least one combustion chamber enclosed by a cylinder, and a piston moving in the cylinder.

Generic internal combustion engines (piston engines) with carburetion or fuel injection are sufficiently well known. Internal combustion engines of this type usually have several cylinders, in which an axially moving piston encloses a combustion chamber, in which the combustion of a fuel-air mixture fed into the combustion chamber occurs.

A well-known problem of internal combustion engines of this type is the formation of carbonization residues of the fuel and motor oil fed to the engine. These residues are bituminous and, in part, highly complex mixtures of hydrocarbons, which are deposited and accumulate on valves, piston surfaces, intake ports, injection nozzles, and the upper surface of the combustion chamber. These carbonization residues may accumulate to such an extent, especially on intake valves, that they produce undesired changes in the fluid dynamics or closing behavior of the valve. Carbonization residues can also have extremely negative effects on other component surfaces of the combustion chamber, for example, the piston working surfaces. The problem of carbon deposits affects especially internal combustion engines with direct fuel injection.

SUMMARY OF THE INVENTION

The objective of the present invention is to develop an internal combustion engine with reduced component carbon deposits.

Pursuant to this object, and others which will become apparent hereafter, one aspect of the present invention resides in providing a surface of at least one component of the combustion chamber that comes into contact with a fuel-air mixture to be combusted in the combustion chamber, at least in certain areas, with a catalytic coating. The catalytic coating is capable of promoting oxidation of carbonization residues of the fuel and motor oil fed into the combustion chamber. Although the coating of the invention may not be able to suppress the formation and deposition of carbonization residues, the rapid oxidation of the carbonaceous deposits at a boundary layer between the catalyst and the carbon deposits at typical operating temperatures brings about early dissolution of the deposits under the action of the flow that exists in the area. In this way, a buildup of carbonization residues on the surfaces in question can be greatly reduced or even completely suppressed. Accordingly, the operation of the components and the engine is not impaired during their service life.

Vanadium oxide coatings have been found to be especially advantageous, especially coatings made of vanadium pentoxide ($V_2O_5$), which may also contain other compounds as additives, as will be explained below. Components with vanadium pentoxide coatings are able to bring about rapid oxidative incineration of carbonization residues starting at temperatures above about 300° C., i.e., starting at about the usual operating temperatures. Reoxidation of the vanadium pentoxide, which is reduced in this process, occurs spontaneously, so that its catalytic effectiveness is maintained. On the other hand, uncoated components show no incineration of the deposits, even at temperatures above 400° C., but rather show an especially disadvantageous tendency to burn into the components, which are generally made of steel or aluminum. Similarly advantageous coatings may contain, alternatively or additionally to the vanadium oxide, ternary vanadium oxide compounds, especially vanadium oxynitride with the composition $V_2O_{5-x}N_x$ or vanadium oxycarbide with the composition $V_2O_{5-x}C_x$ with $0 \leq x \leq 1$.

As has already been mentioned, it is especially advantageous for the binary or ternary vanadium oxide coating, which acts as a "base catalyst", to contain other compounds as additives. The purpose of these additives is to counteract the deposition of carbonization residues even more strongly or to shift the minimum catalytic temperature of the base catalyst towards lower temperatures. Furthermore, these additives may improve the heating behavior of the spraying oil-flow mixture and accelerate evaporation of high-boiling hydrocarbon fractions of the carbonization residues by partial oxidation, cracking reactions, and shift reactions. Metal compounds, especially metal oxides, are potential additives. Cerium oxide, especially cerium dioxide ($CeO_2$), has proven especially effective here. However, oxides of one of the other rare-earth metals and/or of lanthanum are also candidates. Other suitable compounds are transition-metal oxides, especially of the iron group (Fe, Co, Ni), the platinum group (Ru, Rh, Pd, Os, Ir, Pt), the copper group (Cu, Ag, Au), and/or the zinc group (Zn, Cd, Hg).

The coating is preferably applied to the surface of the component in question by plasma-supported and/or ion-supported vacuum processes, especially by arc vaporization of a suitable target in the presence of oxygen. To produce a pure vanadium pentoxide coating, a target of, say, pure vanadium is vaporized, and the vaporized vanadium instantaneously reacts with the oxygen that is present and is deposited in the form of $V_2O_5$ on the surface to be coated. On the other hand, to produce a vanadium oxide coating with one or more of the specified additives, a target can be used which consists of a mixture/alloy of vanadium and the appropriate additional metal. Alternatively, successive arc vaporization of a vanadium target and a target of the one or more additional metals can be carried out.

In addition, it is possible to produce pure vanadium oxide coatings by applying a suitable vanadium compound, especially vanadium nitride or vanadium carbide, on the surface to be coated and then oxidizing it in the presence of oxygen at temperatures of about 350° C. to about 450° C.

"Chemical impregnation" is another method that may be used to add a metal additive to a binary or ternary vanadium oxide coating that has already been produced. In this method, a solution of a salt of the metal to be added, especially an alcoholic nitrate solution, is applied to the base catalyst coating and then thermally oxidized in the presence of oxygen.

A variant method for producing the vanadium oxide coating is application by sol-gel processes. In a process or this type, first a gel is produced, for example, by mixing vanadium isopropoxide with a cerium alcoholate in the desired quantitative ratio and then adding polyethylene glycol to the mixture. The gel produced in this way is applied to the desired surfaces and subjected to a multistep pyrolysis process at temperatures of about 400–500° C., preferably 425–475° C., and especially 450° C. This pyrolysis process results in the formation of a nanostructured film of vanadium pentoxide ($V_2O_5$) and cerium dioxide ($CeO_2$) with high catalytic activity.

BRIEF DESCRIPTION OF THE DRAWING

The invention is explained in greater detail below with reference to embodiments illustrated by the drawing.

The sole drawing shows a schematic sectional view of internal combustion engine components associated with the combustion chamber.

Only one cylinder 12 of an internal combustion engine 10 is shown as an example. Naturally, the internal combustion engine 10 may have several cylinders in a variety of configurations. The cylinder 12 contains an axially moving piston 14, whose reciprocating motion is converted to the rotational motion of a crankshaft, which is not shown. In the interior space of the cylinder 12, a combustion chamber 16 is bounded by the piston 14 and sealed by piston rings 15. On one side, an intake port 20, through which air is fed into the combustion chamber 16, opens into the cylinder head 18 of the cylinder 12, and on the other side, an exhaust port 22, through which exhaust gas is discharged, opens into the cylinder head 18. The intake port 20 and the exhaust port 22 are opened and closed by an intake valve 24 and an exhaust valve 26, respectively, which are asynchronously operated by a camshaft, which is not shown. Naturally, each cylinder may be provided with more than one intake port and exhaust port, each equipped with its own valve, for example, two intake ports and two exhaust ports. An air mass flow to be supplied to the combustion chamber 16 is controlled as a function of engine load by a controllable butterfly valve 28 installed in the intake port 20. A high-pressure injection valve 30 for injecting fuel into the combustion chamber 16 and a spark plug 32 for igniting the fuel-air mixture are also installed in the cylinder head 18. Although the invention is being explained here with reference to a spark-ignition engine, it can be used to equally good advantage in diesel engines.

As was explained in the introductory remarks, internal combustion engines 10 with direct injection are subject to the problem of carbonization of the fuel and motor oil supplied to the engine, especially in lean stratified charge operation, which leads to deposits of carbonization residues on the surfaces of various components of the combustion chamber 16. The buildup of carbon deposits can then lead to impaired operation of the internal combustion engine 10. In particular, carbonization residues on the valve surface 36 of the intake and exhaust valves 24, 26 and on the inside walls of the intake and exhaust ports 20, 22 can cause detrimental changes in the closing behavior of the valves 24, 26 and in the fluid dynamics of the intake air. Deposits on the usually precision-machined piston head 34 or the upper surface of the combustion chamber formed by the cylinder head 18 can also have an unfavorable effect on the flow conditions that exist in the combustion chamber 16. Furthermore, carbonization residues on the piston working surface 38 and the cylinder working surface 40 can also interfere with piston movement. Finally, the operation of the injection valves 30 can be impaired by deposits on the injection nozzle.

In accordance with the invention, the endangered surfaces specified above are at least partly covered with a catalytic coating, which is able to catalyze rapid oxidation of the adhering carbonization residues and thus accelerate their dissolution at ordinary operating temperatures. This coating preferably contains an oxidation-active catalyst based on vanadium pentoxide, whose activity can be further increased by the addition of, for example, cerium oxide, tungsten oxide, and/or molybdenum oxide. In addition, substances may be added which cause faster vaporization of the high-boiling hydrocarbons that accumulate in the sticky, bituminous material.

In a first embodiment, a vanadium-cerium oxide mixed phase is deposited on the surface 36 of the intake valve 24 by a PVD (physical vapor deposition) process, for example, with the use of cathodic arc discharge to vaporize a target of the composition 82% vanadium and 18% cerium in a vacuum at an oxygen pressure of $5 \times 10^{-3}$ mbars. This initially results in the formation of a suboxide with the composition given by the formula $(Ce_y V_y)O_{2-x}$, which rapidly oxidizes to $CeO_2/V_2O_5$ by subsequent spontaneous reoxidation in air.

In another embodiment, a similar coating is produced by first depositing a vanadium suboxide coating (oxidation state <5) on the surface 36 of the intake valve 24 under the same process conditions by vaporization of a pure vanadium target. An alcoholic cerium nitrate solution is then sprayed onto the vanadium suboxide coating to form a thin film of cerium nitrate. The vanadium suboxide and the cerium salt are then pyrolyzed at temperatures $\geq 400°$ C. to form the corresponding mixed-metal oxides with the highest oxidation states of the two metals, i.e., +5 and +4, respectively.

Valves coated in this way were tested in simulation tests in laboratory furnaces. It was found that a carbon oil film is already able to separate from the valve surface at temperatures below 300° C. by boundary layer oxidation. Trace amounts of the elements cerium, nickel, chromium, zinc, and/or molybdenum in the vanadium pentoxide coating result in a further reduction of the formation of the voluminous bituminous carbonization residues. This can apparently be attributed to faster vaporization of the oil and an associated reduced tendency of soot particles to agglomerate on the surface.

A variant method for producing the vanadium oxide coating is application by sol-gel processes. In a process or this type, first a gel is produced, for example, by mixing vanadium isopropoxide with a cerium alcoholate in the desired quantitative ratio and then adding polyethylene glycol to the mixture. The gel produced in this way is applied to the desired surfaces and subjected to a multistep pyrolysis process at temperatures of about 400–500° C., preferably 425–475° C., and especially 450° C. This pyrolysis process results in the formation of a nanostructured film of vanadium pentoxide ($V_2O_5$) and cerium dioxide ($CeO_2$) with high catalytic activity.

What is claimed is:

1. An internal combustion engine, comprising a cylinder and a piston movable in the cylinder, the cylinder and piston defining a combustion chamber enclosed by the cylinder and the piston, a surface of at least one of at least one component of the combustion chamber and an adjoining space that comes into contact with at least one of a fuel-air mixture and with motor oil is at least partially coated with a catalytic coating for oxidizing carbonization residues, the coating consists of a ternary vanadium oxide compound and at least one other compound of at least one metal oxide, the metal oxide is at least one of the group consisting of a cerium oxide, an oxide of another rare-earth metal, an oxide of lanthanum (La), and an oxide of a transition metal.

2. An internal combustion engine in accordance with claim 1, wherein the ternary vanadium oxide compound is one of vanadium oxynitride with a composition $V_2O_{5-x}N_x$ and vanadium oxycarbide with a composition $V_2O_{5-x}C_x$ wherein $0 \leq x \leq 1$.

3. An internal combustion engine in accordance with claim 1, wherein the cerium oxide is cerium dioxide ($CeO_2$).

4. An internal combustion engine in accordance with claim 1, wherein the transition metal belongs to at least one of the iron group, the platinum group, the copper group, and the zinc group.

5. An internal combustion engine in accordance with claim 1, wherein the at least one component is at least one of an intake valve, an exhaust valve, an intake port, an exhaust port, an injection valve, the piston, and the cylinder.

6. An internal combustion engine in accordance with claim 5, wherein the surface is at least one of a valve surface of at least one of an intake valve and an exhaust valve, an inside wall of at least one of an intake port and an exhaust port, an injection nozzle of the injection valve, a piston head, a piston working surface of the piston, a cylinder working surface, and an upper surface of the combustion chamber of the cylinder.

7. An internal combustion engine in accordance with claim 1, wherein the internal combustion engine has direct fuel injection by which fuel can be injected directly into the combustion chamber.

8. An internal combustion engine in accordance with claim 7, wherein the coating is applied one of by arc vaporization of one of a target made of vanadium and a target made of an alloy of vanadium and the metal of at least one other metal oxide, and by successive arc vaporization of a target made of vanadium and a target made of the metal(s) of the at least one metal oxides in the presence of oxygen.

9. An internal combustion engine in accordance with claim 1, wherein the coating is applied to the surface by at least one of a plasma-supported vacuum process and an ion-supported vacuum process.

10. An internal combustion engine in accordance with claim 1, wherein the coating is applied to the surface by application of a vanadium compound followed by thermal oxidation in the presence of oxygen.

11. An internal combustion engine in accordance with claim 10, wherein the vanadium compound is one of vanadium nitride and vanadium carbide.

12. An internal combustion engine in accordance with claim 1, wherein the at lest one metal oxide is introduced into the coating by applying a metal salt solution to the coating of the ternary vanadium oxide compound, followed by thermal oxidation in the presence of oxygen.

13. An internal combustion engine in accordance with claim 1, wherein the coating is applied to the surface by applying a gel and then using a pyrolysis process.

14. An internal combustion engine in accordance with claim 13, wherein the gel consists of vanadium isopropoxide and a cerium alcoholate.

15. An internal combustion engine in accordance with claim 14, wherein polyethylene glycol is added to the gel.

16. An internal combustion engine in accordance with claim 15, wherein the gel applied to the desired surfaces is subjected to a pyrolysis process at a temperature of about 400–500° C.

* * * * *